(12) United States Patent
Hung et al.

(10) Patent No.: US 9,985,020 B2
(45) Date of Patent: May 29, 2018

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Ching-Wen Hung, Tainan (TW); Yi-Kuan Wu, Kaohsiung (TW); Jia-Rong Wu, Kaohsiung (TW); Yi-Hui Lee, Taipei (TW); Ying-Cheng Liu, Tainan (TW); Chih-Sen Huang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 15 days.

(21) Appl. No.: 14/932,993

(22) Filed: Nov. 5, 2015

(65) Prior Publication Data

US 2017/0098707 A1 Apr. 6, 2017

(30) Foreign Application Priority Data

Oct. 6, 2015 (TW) .............................. 104132809 A (51) Int. Cl.
| | |
|---|---|
| *H01L 21/02* | (2006.01) |
| *H01L 27/088* | (2006.01) |
| *H01L 29/66* | (2006.01) |
| *H01L 21/31* | (2006.01) |
| *H01L 21/311* | (2006.01) |

(Continued)

(52) U.S. Cl.
CPC ...... *H01L 27/088* (2013.01); *H01L 21/02521* (2013.01); *H01L 21/28518* (2013.01); *H01L 21/28568* (2013.01); *H01L 21/31* (2013.01); *H01L 21/31116* (2013.01); *H01L 29/41725* (2013.01); *H01L 29/41766* (2013.01); *H01L 29/66643* (2013.01); *H01L 29/66969* (2013.01); *H01L 29/165* (2013.01); *H01L 29/66545* (2013.01); *H01L 29/66636* (2013.01)

(58) Field of Classification Search
CPC .................................................. H01L 29/7839
USPC ........................................................ 257/384
See application file for complete search history.

(56) References Cited

U.S. PATENT DOCUMENTS

| | | | |
|---|---|---|---|
| 6,699,725 B2 * | 3/2004 | Lee ........................ | H01L 28/55 257/E21.009 |
| 7,160,800 B2 | 1/2007 | Wu | |

(Continued)

*Primary Examiner* — Ajay K Arora
(74) *Attorney, Agent, or Firm* — Winston Hsu (57) ABSTRACT

A manufacturing method of a semiconductor structure includes the following steps. An epitaxial region is formed in a semiconductor substrate. A dielectric layer is formed on the epitaxial region, and a contact hole is formed in the dielectric layer. The contact hole exposes a part of the epitaxial region, and an oxide-containing layer is formed on the epitaxial region exposed by the contact hole. A contact structure is formed in the contact hole and on the oxide-containing layer. The oxide-containing layer is located between the contact structure and the epitaxial region. A semiconductor structure includes the semiconductor substrate, at least one epitaxial region, the contact structure, the oxide-containing layer, and a silicide layer. The contact structure is disposed on the epitaxial region. The oxide-containing layer is disposed between the epitaxial region and the contact structure. The silicide layer is disposed between the oxide-containing layer and the contact structure.

15 Claims, 4 Drawing Sheets

(51) Int. Cl.
*H01L 21/285* (2006.01)
*H01L 29/417* (2006.01)
*H01L 29/165* (2006.01)

(56) References Cited

U.S. PATENT DOCUMENTS

| | | |
|---|---|---|
| 7,763,946 B2 | 7/2010 | Tsuchiya |
| 2010/0001317 A1* | 1/2010 | Chen ............... H01L 21/26506 257/192 |
| 2010/0123198 A1* | 5/2010 | Kim ................ H01L 21/26506 257/377 |
| 2010/0200928 A1 | 8/2010 | Ichinose |
| 2013/0032883 A1* | 2/2013 | Chan ............... H01L 21/2254 257/365 |
| 2013/0316535 A1 | 11/2013 | Shin |
| 2014/0124842 A1 | 5/2014 | Wang |
| 2014/0264494 A1* | 9/2014 | Xu .................. H01L 29/41725 257/288 |
| 2015/0111359 A1 | 4/2015 | Tsai |
| 2015/0235956 A1* | 8/2015 | Lin ................. H01L 23/53266 257/757 |

* cited by examiner

SEMICONDUCTOR STRUCTURE AND MANUFACTURING METHOD THEREOF

BACKGROUND OF THE INVENTION

1. Field of the Invention

The present invention relates to a semiconductor structure and a manufacturing method thereof, and more particularly, to a semiconductor structure including an oxide-containing layer formed between a contact structure and an epitaxial region for lowering the contact resistance and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. As the size of the device becomes smaller, the influence of the contact resistance at the interface between the source/drain contact and the source/drain on the electrical properties (such as on-current Ion) of the device becomes more significant. Therefore, the related industries continuously endeavor to improve the related materials and structures for reducing the contact resistance between the source/drain contact and the source/drain as much as possible, so as to satisfy device requirements and enhance device performances.

SUMMARY OF THE INVENTION

A manufacturing method of a semiconductor structure is provided in an embodiment of the present invention. The manufacturing method includes the following steps. An epitaxial region is formed in a semiconductor substrate. A dielectric layer is formed on the epitaxial region. A contact hole is formed in the dielectric layer, and the contact hole exposes a part of the epitaxial region. An oxide-containing layer is formed on the epitaxial region exposed by the contact hole. A contact structure is formed in the contact hole and on the oxide-containing layer. The oxide-containing layer is located between the contact structure and the epitaxial region.

A semiconductor structure is provided in an embodiment of the present invention. The semiconductor structure includes a semiconductor substrate, at least one epitaxial region, a contact structure, an oxide-containing layer, and a silicide layer. The epitaxial region is disposed in the semiconductor substrate. The contact structure is disposed on the epitaxial region. The oxide-containing layer is disposed between the epitaxial region and the contact structure. The silicide layer is disposed between the oxide-containing layer and the contact structure.

A semiconductor structure is provided in another embodiment of the present invention. The semiconductor structure includes a semiconductor substrate, at least one epitaxial region, a contact structure, and a metal oxide-containing layer. The epitaxial region is disposed in the semiconductor substrate. The contact structure is disposed on the epitaxial region. The metal oxide-containing layer is disposed between the epitaxial region and the contact structure. The metal oxide-containing layer includes a first region and a second region, the first region is disposed between the contact structure and the second region, and a metal concentration of the first region is higher than a metal concentration of the second region.

In the semiconductor structure and the method thereof in the present invention, the oxide-containing layer and/or the metal oxide-containing layer is formed between the epitaxial region and the contact structure for lowering the Schottky barrier height between the layers of the stacked structure. The purposes of lowering the contact resistance and enhancing the device performance of the semiconductor structure may be achieved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor structure according to a first embodiment of the present invention, wherein

DETAILED DESCRIPTION

Figure 1:
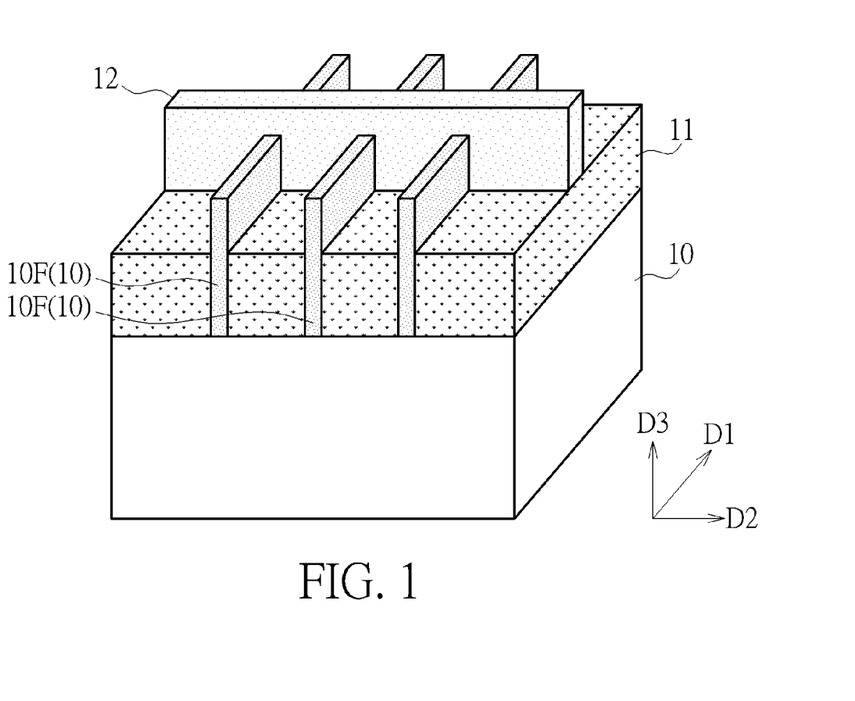
Figure 2:
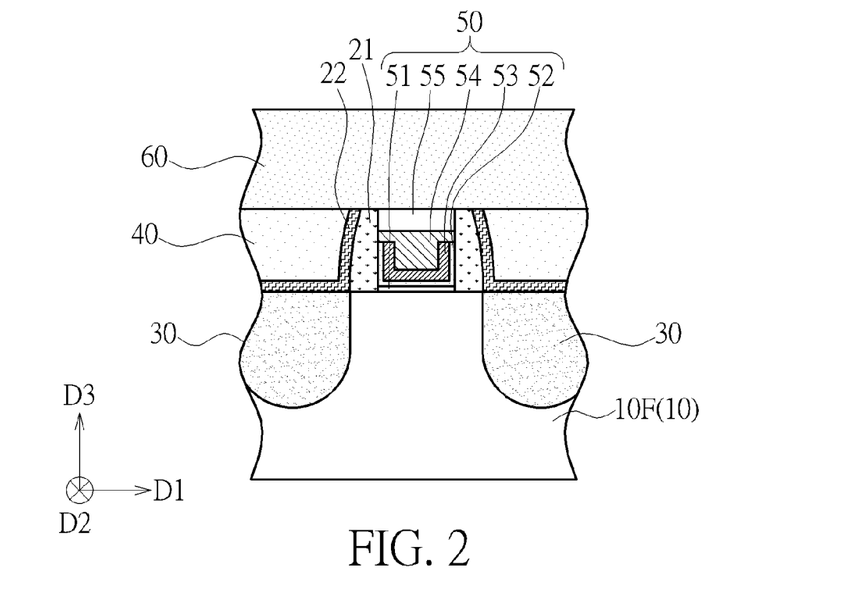
FIG. 2 is a schematic drawing in a step subsequent to FIG. 1.
Figure 4:
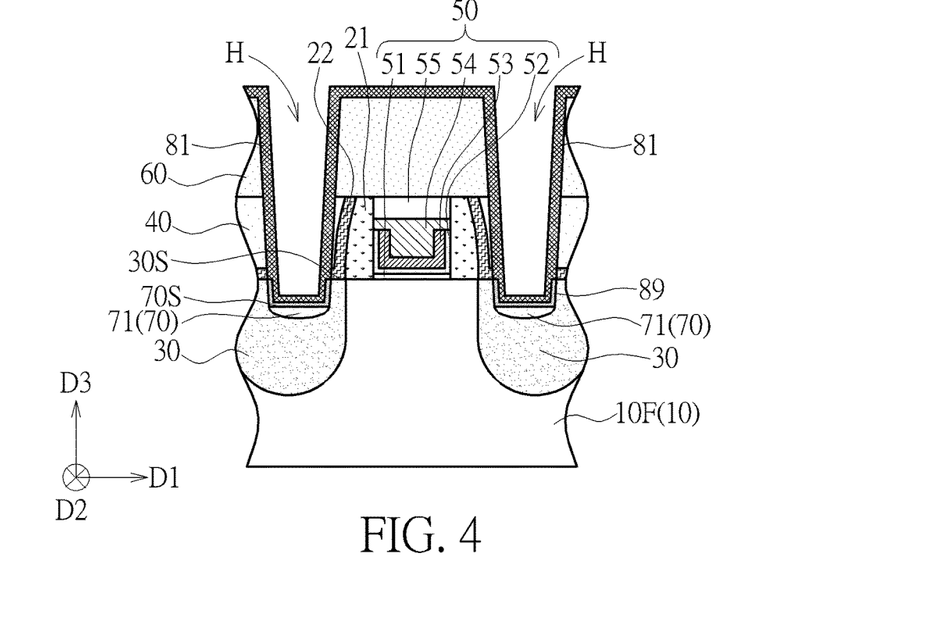
FIG. 4 is a schematic drawing in a step subsequent to FIG. 3.
Figure 5:
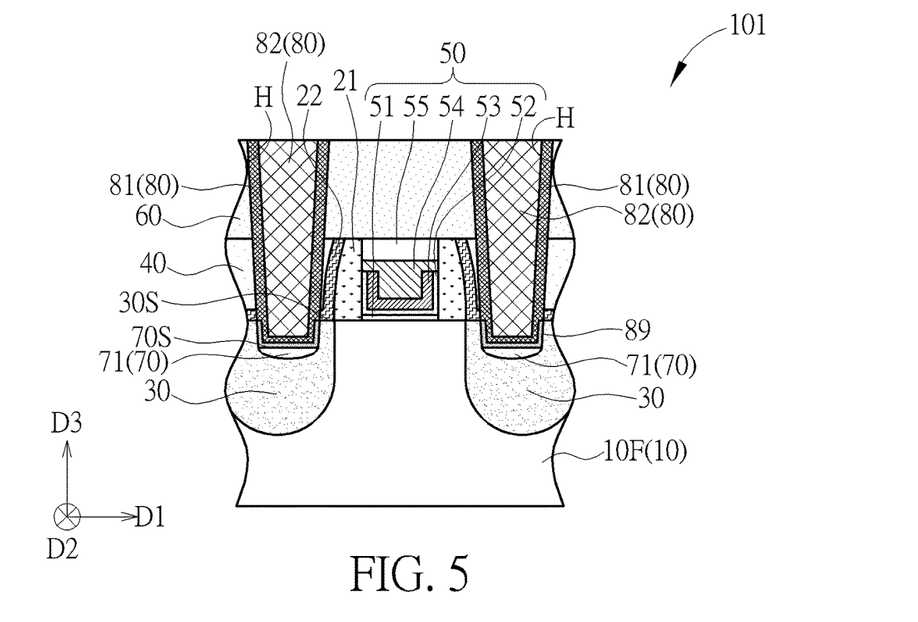
FIG. 5 is a schematic drawing in a step subsequent to FIG. 4.
Figure 6:
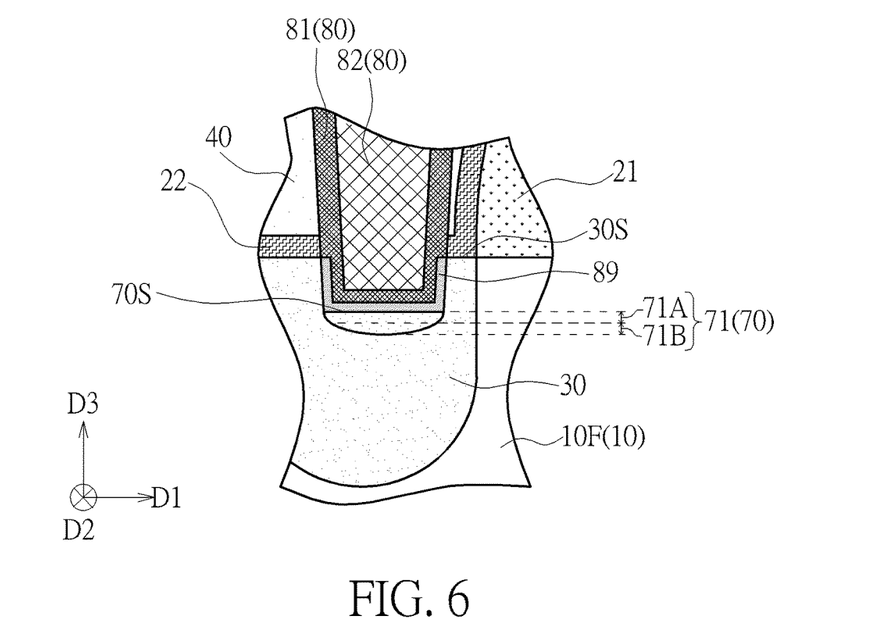
FIG. 6 is an enlarged schematic drawing illustrating an epitaxial region in FIG. 5.

Please refer to FIGS. 1-6. FIGS. 1-5 are schematic drawings illustrating a manufacturing method of a semiconductor structure according to a first embodiment of the present invention, and FIG. 6 is an enlarged schematic drawing illustrating an epitaxial region in FIG. 5. The manufacturing method of the semiconductor structure in this embodiment includes the following steps. As shown in FIG. 1, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 may also have a plurality fin structures 10F extending in a first direction D1 according to design requirements, and the fin structures 10F may be separated from one another by shallow trench isolation (STI) 11, but not limited thereto. Additionally, a dummy gate 12 may be formed on the fin structures 10F and extend in a second direction D2, and the first direction D1 and the second direction D2 are orthogonal to each other substantially, but not limited thereto. As shown in FIG. 1 and FIG. 2, at least one epitaxial region 30 is then formed in the semiconductor substrate 10. In this embodiment, two epitaxial regions 30 may be formed at two opposite sides of the dummy gate 12 in the first direction D1, and the epitaxial region 30 may include a silicon phosphorus (SiP) epitaxial region, a silicon germanium (SiGe) epitaxial region, a silicon carbide (SiC) epitaxial region, or epitaxial regions formed by other appropriate materials. In addition, a sidewall spacer 21, a contact etching stop layer (CESL) 22, and a first dielectric layer 40 shown in FIG. 2 may be selectively formed, and a process such as a replacement metal gate (RMG) process may be used to remove the dummy gate 12 and form a gate structure 50 including an interfacial layer 51, a high-k dielectric layer 52, a gate barrier layer 53, a metal gate 54, and a protection layer 55, but not limited thereto. In other words, the first dielectric layer 40 is formed on the epitaxial region 30. The sidewall spacer 21, the contact etching stop layer 22, the first dielectric layer 40, and the gate structure 50 may have the same level in a third direction D3 perpendicular to the semiconductor substrate 10 after a planarization process, and a second dielectric layer 60 may then be formed to cover the gate structure 50 and the first dielectric layer 40. The second dielectric layer 60 in this embodiment may be regarded as a pre-metal dielectric (PMD), but not limited thereto.

Figure 3:
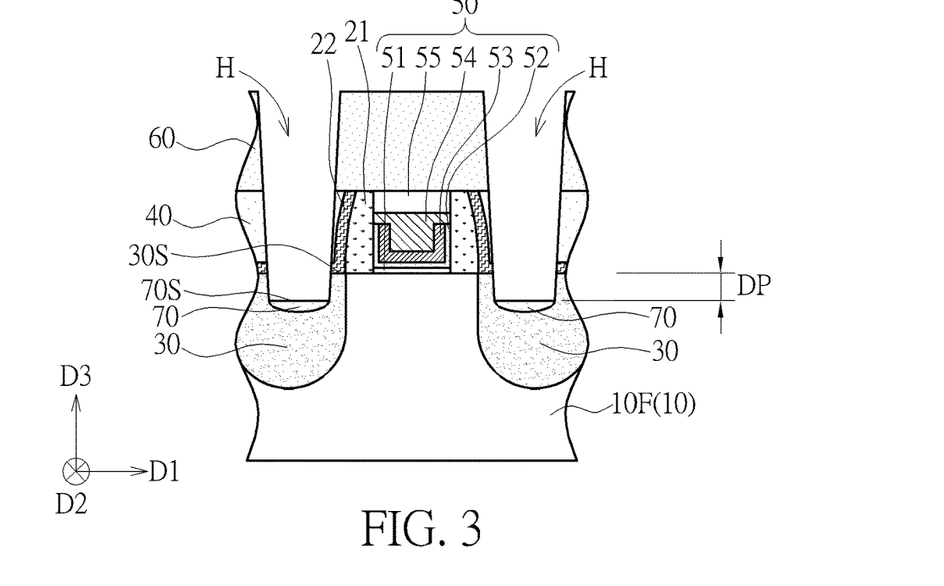
FIG. 3 is a schematic drawing in a step subsequent to FIG. 2.

As shown in FIG. 3, the second dielectric layer 60 and the first dielectric layer 40 may then be patterned by using a patterned photoresist (not shown) for forming a contact hole H in the first dielectric layer 40. The contact hole H is formed corresponding to the epitaxial region 30, and the contact hole H exposes a part of the corresponding epitaxial region 30. An oxide-containing layer 70 is formed on the epitaxial region 30 exposed by the contact hole H. In this embodiment, the contact hole H penetrates the second dielectric layer 60, the first dielectric layer 40, and the contact etching stop layer 22 preferably, and a part of the epitaxial region 30 is removed by the process of forming the contact hole H, such as an etching process. Therefore, the contact hole H extends into the epitaxial region 30 preferably, so as to ensure that the epitaxial region 30 is partially exposed by the contact hole H, but the present invention is not limited to this. In other embodiments of the present invention, the contact hole H may just stop on a top surface of the epitaxial region 30 without extending into the epitaxial region 30 according to other considerations. Additionally, it is worth noting that the oxide-containing layer 70 may also be formed by the process of forming the contact hole H, such as the etching process mentioned above, and the epitaxial region 30 in this situation may be a silicon phosphorus epitaxial region with higher phosphorus concentration preferably. For example, the phosphorus concentration of the silicon phosphorus epitaxial region may be higher than or equal to 2E21 atoms/cm$^3$, and the phosphorus concentration may range between 2E21 atoms/cm$^3$ and 5E21 atoms/cm$^3$ preferably, but not limited thereto. Under the condition of the epitaxial region 30 with higher phosphorus concentration, oxygen may be absorbed by phosphorus for being reacted in the etching process of forming the contact hole H and forming the oxide-containing layer 70. In other words, the manufacturing method in this embodiment may include increasing the phosphorus concentration of the epitaxial region 30 during the step of forming the epitaxial region 30 and forming the oxide-containing layer 70 in the step of forming the contact hole H without using additional process steps to form the oxide-containing layer 70. In other embodiments of the present invention, other approaches such as an oxygen treatment, an implantation process, anatomic layer deposition process, or other appropriate processes may be applied to form the oxide-containing layer 70 on the epitaxial region 30 exposed by the contact hole H after the step of forming the contact hole H according to other considerations. Therefore, the oxide-containing layer 70 in this embodiment may include silicon oxide, phosphorus oxide, and other appropriate oxide.

In this embodiment, a topmost surface of the oxide-containing layer 70 (such as a second topmost surface 70S shown in FIG. 3) is lower than a topmost surface of the epitaxial region 30 (such as a first topmost surface 30S shown in FIG. 3). A distance between the first topmost surface 30S and the second topmost surface 70S in the third direction D3 (such as a depth DP shown in FIG. 3) may be controlled to range between 100 angstroms and 50 angstroms, the depth DP may be 80 angstroms preferably, and the thickness of the oxide-containing layer 70 may be around 40 angstroms under this situation preferably, but not limited thereto. In addition, when the oxide-containing layer 70 in this embodiment is formed by the etching process of forming the contact hole H and the etching process is an anisotropic etching process, the oxide-containing layer 70 tends to have a center region thicker than two edge regions in the first direction D1, and the oxide-containing layer 70 in this condition may be regarded as a pocket-shaped oxide-containing layer or a half-moon oxide-containing layer, but the present invention is not limited to this. In other embodiments of the present invention, the oxide-containing layer 70 in other shapes, such as a stripe-shaped oxide-containing layer or a U-shaped oxide-containing layer, may also be formed according to different process parameters or other additional processes for forming the oxide-containing layer 70.

Subsequently, as shown in FIG. 4 and FIG. 5, a contact structure 80 is formed in the contact hole H and on the oxide-containing layer 70. The contact structure 80 may include a barrier metal layer 81 and a main metal layer 82. The barrier metal layer 81 may be formed conformally in the contact hole H first, the main metal layer 82 may be formed after the step of forming the barrier metal layer 81, and the contact hole H may be filled with the main metal layer 82. A planarization process may be used to make upper parts of the second dielectric layer 60, the barrier metal layer 81 and the main metal layer at the same level, but not limited thereto. In this embodiment, the barrier metal layer 81 may include nickel (Ni), titanium (Ti), titanium nitride (TiN), tantalum (Ta), tantalum nitride (TaN), titanium aluminum oxide (TiAlO), or other appropriate conductive materials with a single layer structure or a multiple layer structure. The main metal layer 82 may include conductive materials with relatively lower electrical resistivity, such as aluminum (Al), tungsten (W), or copper (Cu), but not limited thereto. After the step of forming the contact structure 80, the oxide-containing layer 70 is located between the contact structure 80 and the epitaxial region 30, and a metal-insulator-Si stacked structure may be formed accordingly. Compared with the metal-Si stacked structure without forming the oxide-containing layer, the metal-insulator-Si stacked structure may have a lower Schottky barrier height, the contact resistance between the contact structure 80 and the epitaxial region 30 may be reduced, and the device performance of a semiconductor structure 101 shown in FIG. 5 may be enhanced accordingly. It is worth noting that, after the step of forming the contact hole H and before the step of forming the barrier metal layer 81, a cleaning process may be performed to remove residues of the etching process in the contact hole H according to other considerations. The oxide-containing layer 70 in this embodiment has a specific thickness (about 40 angstroms for example) and is not a native oxide formed by being exposed in a normal environment. The oxide-containing layer 70 will not be removed by the cleaning process and will remain to other processes subsequent to the cleaning process. Additionally, when the oxide-containing layer 70 is formed by the process of forming the contact hole H, the phosphorus concentration of the epitaxial region 30 may be higher than or equal to 2E21 atoms/cm$^3$ preferably, so as to form the required oxide-containing layer 70. For instance, when the epitaxial region 30 is a silicon phosphorus epitaxial region with a phosphorus concentration equal to about 1.5E21 atoms/cm$^3$, only an extremely thin oxide-containing layer will be formed in the process of forming the contact hole H and will be removed by the subsequent cleaning process. In addition, according to the experiment results, when the oxide-containing layer 70 of this embodiment is formed between the barrier metal layer 81 and the epitaxial region 30, the contact resistance between the barrier metal layer 81 and the epitaxial region 30 may be lowered to be about 64.4% of a contact resistance of the condition without forming the oxide-containing layer 70 (such as the above-mentioned condition with the phosphorus concentration of the epitaxial region equal to about 1.5E21 atoms/cm$^3$). Therefore, the contact resistance between the contact structure 80 and the epitaxial region 30 is effectively reduced because of the oxide-containing layer 70.

As shown in FIG. 4 and FIG. 5, the manufacturing method in this embodiment may further include forming a silicide layer 89 between the contact structure 80 and the oxide-containing layer 70. The silicide layer 89 is formed at the interface between the barrier metal layer 81 and the epitaxial region 30 and formed at the interface between the barrier metal layer 81 and the oxide-containing layer 70, and the silicide layer 89 may be a U-shaped silicide layer directly contacting the epitaxial region 30 and the oxide-containing layer 70, but not limited thereto. In this embodiment, the silicide layer 89 may include a silicide of the barrier metal layer 81. For example, when the barrier metal layer 81 includes titanium, the silicide layer 89 may include titanium silicide (TiSi$_x$), but not limited thereto. Additionally, in other embodiments of the present invention, apart from the method of forming the silicide 89 described above, the silicide layer 89 may also be formed before the step of forming the barrier metal layer 81 by other approaches such as a self-aligned silicide (salicide) process, but not limited thereto. It is worth noting that the oxide-containing layer 70 may include a metal oxide-containing layer 71 after the contact structure 80 is formed in this embodiment. Therefore, apart from forming the silicide layer 89 at the interface, the components of the barrier metal layer 81 may also diffuse into the oxide-containing layer 70 and convert the oxide-containing layer 70 into the metal oxide-containing layer 71 after the step of forming the barrier metal layer 81. The metal oxide-containing layer 71 may include metal oxide (such as TiO$_x$), metal oxynitride (such as TiON), oxide including metal and silicon (MSi$_x$O$_y$, such as TiSiO or NiSiO) and/or oxynitride including metal and silicon (MSi$_x$O$_y$N$_z$, such as TiSiON or NiSiON), but not limited thereto.

More specifically, as shown in FIG. 5 and FIG. 6, the metal oxide-containing layer 71 in this embodiment may include a first region 71A and a second region 71B. The first region 71A is disposed between the contact structure 80 and the second region 71B, and the first region 71A is closer to the contact structure 80 than the second region 71B. A metal concentration (such as a concentration of Ti) of the first region 71A is higher than a metal concentration of the second region 71B because of the diffusion level difference. Additionally, the silicide layer 89 in this embodiment may also be a metal silicide layer containing oxygen, and a metal concentration of the silicide layer 89 is higher than the metal concentration of the first region 71A in the metal oxide-containing layer 71. In other words, the metal concentration may be gradually decreased from the silicide layer 89 to the metal oxide-containing layer 71 and present a gradient variation, but not limited thereto.

A semiconductor structure 101 shown in FIG. 5 may be formed by the manufacturing method described above. The semiconductor structure 101 in this embodiment includes the semiconductor substrate 10, at least one epitaxial region 30, the contact structure 80, the oxide-containing layer 70, and the silicide layer 89. The epitaxial region 30 is disposed in the semiconductor substrate 10. The contact structure 80 is disposed on the epitaxial region 30. The oxide-containing layer 70 is disposed between the epitaxial region 30 and the contact structure 80. The silicide layer 89 is disposed between the oxide-containing layer 70 and the contact structure 80. The characteristics of the components in the semiconductor structure 101 are detailed in the manufacturing method mentioned above and will not be redundantly described. Because the contact hole H partially extends into the epitaxial region 30, apart of the contact structure 80 formed in the contact hole H is surround by the epitaxial region 30 in a horizontal direction (such as a first direction D1). The contact area between the contact structure 80 and the epitaxial region 30 may be increased with the limited size of the contact structure 80, and the contact resistance may be further reduced accordingly. In addition, the semiconductor structure 101 may include the gate structure 50 disposed on the semiconductor substrate 10, and the epitaxial region 30 may include or become a source/drain region corresponding to the gate structure 50 by a process such as an implantation process.

As shown in FIG. 5 and FIG. 6, the semiconductor structure 101 in this embodiment may also be regarded as a semiconductor structure including the semiconductor substrate 10, at least one epitaxial region 30, the contact structure 80, and the metal oxide-containing layer 71. The metal oxide-containing layer 71 is disposed between the epitaxial region 30 and the contact structure 80. The metal oxide-containing layer 71 includes the first region 71A and the second region 71B. The first region 71A is disposed between the contact structure 80 and the second region 71B, and the metal concentration of the first region 71A is higher than the metal concentration of the second region 71B. Additionally, the silicide layer 89 in this embodiment may also be a metal silicide layer containing oxygen, and the silicide layer 89 and the oxide-containing layer 70 may be regarded as one metal oxide-containing layer as a whole. The silicide layer 89 may be regarded as the first region with the relatively higher metal concentration in this metal oxide-containing layer, and the oxide-containing layer 70 may be regarded as the second region with the relatively lower metal concentration in this metal oxide-containing layer.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
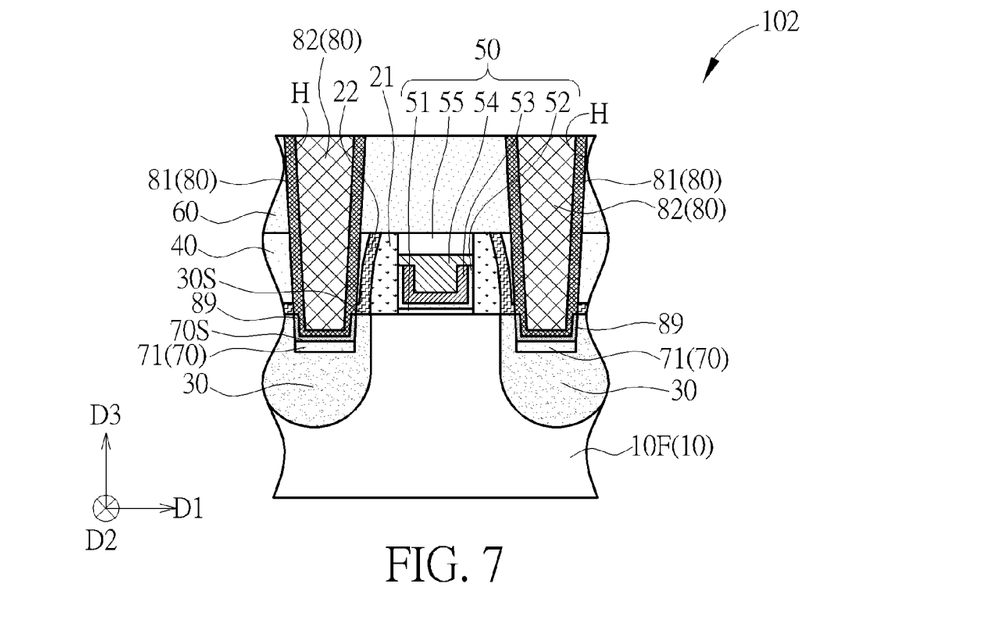
FIG. 7 is a schematic drawing illustrating a semiconductor structure according to a second embodiment of the present invention.

Please refer to FIG. 7. FIG. 7 is a schematic drawing illustrating a semiconductor structure 102 according to a second embodiment of the present invention. As shown in FIG. 7, the difference between this embodiment and the first embodiment mentioned above is that, in the semiconductor structure 102 of this embodiment, the oxide-containing layer 70 is a stripe-shaped oxide-containing layer having a center thickness substantially equal to thicknesses at two edge regions in the first direction D1. Apart from the shape of the oxide-containing layer 70, the other characteristics of the components in the semiconductor structure 102 are similar to those of the first embodiment and will not be redundantly described.

Figure 8:
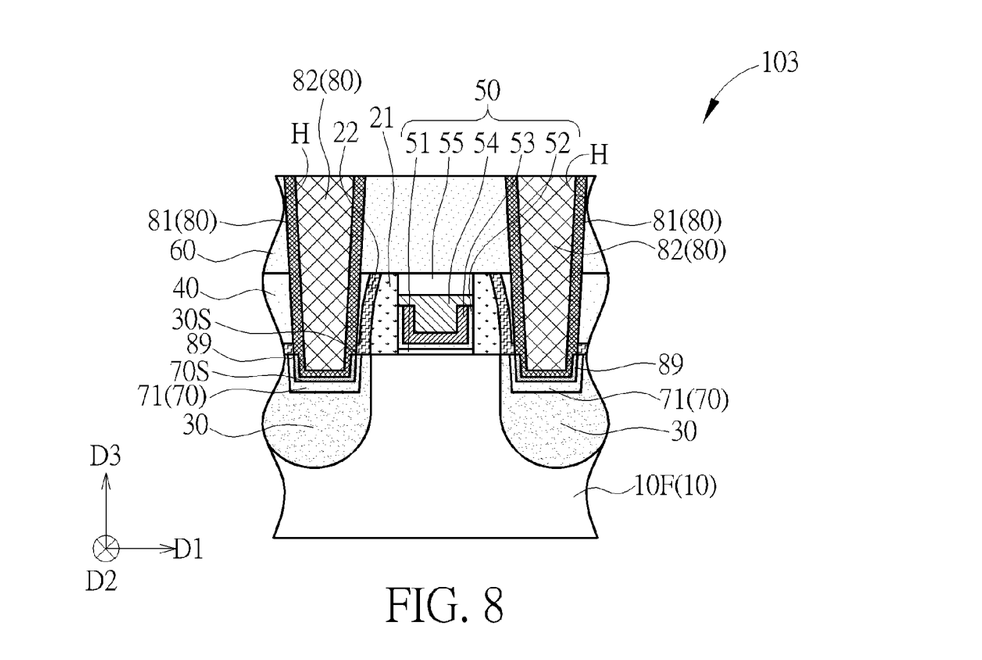
FIG. 8 is a schematic drawing illustrating a semiconductor structure according to a third embodiment of the present invention.

Please refer to FIG. 8. FIG. 8 is a schematic drawing illustrating a semiconductor structure according to a third embodiment of the present invention. As shown in FIG. 8, the difference between this embodiment and the first embodiment mentioned above is that, in the semiconductor structure 103 of this embodiment, the oxide-containing layer 70 is a U-shaped oxide-containing layer, and the shape of the oxide-containing layer 70 may be similar to the shape of the silicide layer 89. As the condition described in the first embodiment, the silicide layer 89 may also be a metal silicide layer containing oxygen, and the silicide layer 89 and the oxide-containing layer 70 may be regarded as one metal oxide-containing layer as a whole. The silicide layer 89 may be regarded as the first region with the relatively higher metal concentration in this metal oxide-containing layer, and the oxide-containing layer 70 may be regarded as the second region with the relatively lower metal concentration in this metal oxide-containing layer. Therefore, in this embodiment, the metal concentration may be gradually changed from the silicide layer 89 to the metal oxide-containing layer 71 in the vertical third direction D3, and the metal concentration may further be gradually changed from the silicide layer 89 to the metal oxide-containing layer 71 in the horizontal direction such as the first direction D1 shown in FIG. 8.

To summarize the above descriptions, in the semiconductor structure and the manufacturing method thereof in the present invention, the oxide-containing layer and/or the metal oxide-containing layer is formed between the epitaxial region and the contact structure for lowering the Schottky barrier height between the layers of the stacked structure. The purposes of lowering the contact resistance and enhancing the device performance of the semiconductor structure may be achieved accordingly. Additionally, the phosphorus concentration of the epitaxial region may be controlled and modified in the present invention for directly forming the oxide-containing layer in the process of forming the contact hole without using other additional processes to form the oxide-containing layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
    forming an epitaxial region in a semiconductor substrate;
    forming a dielectric layer on the epitaxial region;
    forming a contact hole in the dielectric layer, wherein the contact hole exposes a part of the epitaxial region;
    forming an oxide-containing layer on the epitaxial region exposed by the contact hole;
    forming a contact structure in the contact hole and on the oxide-containing layer, wherein the oxide-containing layer is located between the contact structure and the epitaxial region, and the oxide-containing layer comprises a half moon shaped oxide-containing layer or a U-shaped oxide-containing layer, wherein the oxide-containing layer comprises silicon oxide and/or phosphorus oxide; and
    forming a silicide layer between the contact structure and the oxide-containing layer.

2. The method of claim 1, wherein the oxide-containing layer is formed by a process of forming the contact hole.

3. The method of claim 1, wherein a process of forming the oxide-containing layer comprises an oxygen treatment, an implantation process, or an atomic layer deposition process.

4. The method of claim 1, wherein the epitaxial region comprises a silicon phosphorus epitaxial region, and a phosphorus concentration of the silicon phosphorus epitaxial region ranges between 2E21 atoms/cm$^3$ and 5E21 atoms/cm$^3$.

5. The method of claim 1, wherein the oxide-containing layer comprises a metal oxide-containing layer after the contact structure is formed.

6. The method of claim 1, wherein the contact structure comprises a barrier metal layer, and the silicide layer comprises a silicide of the barrier metal layer.

7. The method of claim 1, wherein a part of the epitaxial region is removed by a process of forming the contact hole.

8. The method of claim 7, wherein a topmost surface of the oxide-containing layer is lower than a topmost surface of the epitaxial region.

9. A semiconductor structure, comprising:
    a semiconductor substrate;
    at least one epitaxial region disposed in the semiconductor substrate;
    a contact structure disposed on the epitaxial region;
    an oxide-containing layer disposed between the epitaxial region and the contact structure, wherein the oxide-containing layer comprises a half moon shaped oxide-containing layer or a U-shaped oxide-containing layer; and
    a silicide layer disposed between the oxide-containing layer and the contact structure, wherein the oxide-containing layer comprises silicon oxide and/or phosphorus oxide.

10. The semiconductor structure of claim 9, wherein the epitaxial region comprises a silicon phosphorus region, and a phosphorus concentration of the silicon phosphorus epitaxial region ranges between 2E21 atoms/cm$^3$ and 5E21 atoms/cm$^3$.

11. The semiconductor structure of claim 9, wherein the oxide-containing layer comprises a metal oxide-containing layer.

12. The semiconductor structure of claim 11, wherein the metal oxide-containing layer comprises a first region and a second region, the first region is disposed between the contact structure and the second region, and a metal concentration of the first region is higher than a metal concentration of the second region.

13. The semiconductor structure of claim 9, wherein the contact structure comprises a barrier metal layer, and the silicide layer comprises a silicide of the barrier metal layer.

14. The semiconductor structure of claim 9, wherein a topmost surface of the oxide-containing layer is lower than a topmost surface of the epitaxial region.

15. A semiconductor structure, comprising:
    a semiconductor substrate;
    at least one epitaxial region disposed in the semiconductor substrate;
    a contact structure disposed on the epitaxial region; and a metal oxide-containing layer disposed between the epitaxial region and the contact structure, wherein the metal oxide-containing layer comprises a first region and a second region, the first region is disposed between the contact structure and the second region, and a metal concentration of the first region is higher than a metal concentration of the second region, wherein the metal oxide-containing layer comprises a half moon shaped oxide-containing layer or a U-shaped oxide-containing layer, and the metal oxide-containing layer comprises silicon oxide and/or phosphorus oxide.

* * * * *